United States Patent
Muramatsu et al.

(10) Patent No.: US 7,564,398 B2
(45) Date of Patent: *Jul. 21, 2009

(54) METHOD AND APPARATUS FOR AD CONVERSION, SEMICONDUCTOR DEVICE FOR DETECTING DISTRIBUTION OF PHYSICAL QUANTITY, AND ELECTRONIC APPARATUS

(75) Inventors: Yoshinori Muramatsu, Kanagawa (JP); Noriyuki Fukushima, Kanagawa (JP); Yoshikazu Nitta, Tokyo (JP); Yukihiro Yasui, Kanagawa (JP)

(73) Assignee: Sony Corporation, Tokyo (JP)

( * ) Notice: Subject to any disclaimer, the term of this patent is extended or adjusted under 35 U.S.C. 154(b) by 438 days.

This patent is subject to a terminal disclaimer.

(21) Appl. No.: 11/532,158

(22) Filed: Sep. 15, 2006

(65) Prior Publication Data
US 2007/0024728 A1 Feb. 1, 2007

Related U.S. Application Data

(63) Continuation of application No. 11/059,587, filed on Feb. 16, 2005, now Pat. No. 7,129,883.

(30) Foreign Application Priority Data

Feb. 23, 2004 (JP) ............................ P2004-045942
Apr. 5, 2004 (JP) ............................ P2004-110866

(51) Int. Cl.
*H03M 1/50* (2006.01)
(52) U.S. Cl. .................... 341/168; 257/72; 382/232; 365/230.03; 348/294
(58) Field of Classification Search ......... 341/155–170; 257/72, 290, 222; 382/232, 312; 365/230.03; 348/294, 246, 364, 282, 242
See application file for complete search history.

(56) References Cited

U.S. PATENT DOCUMENTS

| 6,818,933 | B2* | 11/2004 | Henderson et al. | 257/290 |
| 7,250,897 | B2* | 7/2007 | Oh | 341/169 |
| 7,319,423 | B2* | 1/2008 | Augusto et al. | 341/155 |
| 7,375,672 | B2* | 5/2008 | Muramatsu et al. | 341/164 |
| 7,375,751 | B2* | 5/2008 | Lee et al. | 348/294 |

FOREIGN PATENT DOCUMENTS

EP  1107-581  6/2001

OTHER PUBLICATIONS

EP Communication for Application No. 05 003 682.1-2206 dated Jun. 2, 2008.

* cited by examiner

*Primary Examiner*—Lam T Mai
(74) *Attorney, Agent, or Firm*—Sonnenschein Nath & Rosenthal LLP

(57) ABSTRACT

A column analog-to-digital converter having a voltage comparator and a counter is arranged for each a vertical signal line. The voltage comparator compares a pixel signal inputted via the vertical signal line at each row control signal line with a reference voltage, thereby generating a pulse signal having a length in time axis corresponding to the magnitude of a reset component and a signal component. The counter counts a clock to measure the width of the pulse signal until the end of the comparison operation of the comparator, and stores a count at the end of the comparison. A communication and timing controller controls the voltage comparator and the counter so that, in a first process, the voltage comparator performs a comparison operation on a reset component with the counter performing a down-counting operation, and so that, in a second process, the voltage controller performs the comparison operation on a signal component with the counter performing an up-counting operation.

12 Claims, 7 Drawing Sheets

US 7,564,398 B2

METHOD AND APPARATUS FOR AD CONVERSION, SEMICONDUCTOR DEVICE FOR DETECTING DISTRIBUTION OF PHYSICAL QUANTITY, AND ELECTRONIC APPARATUS

CROSS REFERENCE TO RELATED APPLICATIONS

This is a continuation of U.S. application Ser. No. 11/059,587, filed on Feb. 16, 2005 now U.S. Pat. No. 7,129,883, which claims priority to Japanese Application No. P2004-045942, filed on Feb. 23, 2004 and Japanese Application No. P2004-110866, filed on Apr. 5, 2004, all of which are incorporated herein by reference to the extent permitted by law.

BACKGROUND OF THE INVENTION

The present invention relates to an analog-to-digital (A/D) conversion method, an A/D converter, a semiconductor device, having a plurality of unit elements, for detecting a distribution of a physical quantity, and an electronic apparatus. In particular, the present invention relates to a technique for converting an analog output into digital data in a semiconductor device and an electronic apparatus, in which a plurality of unit elements responsive to an electromagnetic wave inputted from the outside, such as light or radiation rays, converts the input electromagnetic wave into the distribution of the physical quantity as an electrical signal, and the electrical signal is selectively read through address control.

Semiconductor devices for detecting a distribution of physical quantities are widely used. Such semiconductor device includes unit elements (such as pixels) responsive to an electromagnetic wave, such as light or radiation rays, arranged in a line or a matrix.

For example, a charge-coupled device (CCD), a metal-oxide semiconductor (MOS) device, and a complementary metal-oxide semiconductor (CMOS) device, each device for detecting light (one type of the electromagnetic waves) as a physical quantity, are typically used in the video equipment field. After being converted into an electrical signal by a unit element (pixel in the solid-state image pickup device), these devices read the distribution of the physical quantity.

Some solid-state image pickup devices have pixels, each pixel including amplifying solid-state image pickup element (active pixel sensor or also referred to as gain cell). The active pixel sensor includes a drive transistor for generating a pixel signal in response to a signal charge generated in a charge generator. Many of the CMOS solid-state image pickup devices have such a structure.

To read the pixel signal in the amplifying solid-state image pickup device, address control is performed on a pixel area having a plurality of pixels so that a signal is read from any individual pixel. The amplifying solid-state image pickup device is thus an address control type solid-state image pickup device.

The amplifying solid-state image pickup device, which is one type of X-Y addressing solid-state image pickup devices having a matrix of unit pixels, is MOS structured with a MOS transistor in each pixel to impart amplification capability to the pixel. More specifically, an active element amplifies a signal charge (photoelectron) stored in a photodiode as a photoelectric conversion element, and the amplified signal is read.

In such an X-Y addressing solid-state image pickup device, a large number of pixel transistors are arranged in a two-dimensional matrix to form a pixel area. The storage of signal charge starts in the pixels on a per line (row) basis or individually. A current signal or a voltage signal responsive to the stored signal charge is successively read by addressing. In the MOS types (including the CMOS type), in one of the typical address controls, one row of pixels is concurrently accessed and a pixel signal on a per row basis is read from the pixel area.

An analog pixel signal read from the pixel area is converted into digital data by an analog-to-digital (A/D) converter as necessary. Since the output pixel signal is a mixture of a signal component and a reset component, an effective signal component needs to be extracted by taking a difference between a signal voltage corresponding to the reset component and a signal voltage corresponding to the signal component.

The same is true when the analog pixel signal is converted to the digital signal. The difference component between the signal voltage corresponding to the resent component and the signal voltage corresponding to the signal component need to be converted into digital data. To this end, a variety of A/D conversion mechanisms have been proposed in the following patent documents and non-patent documents:

Patent document 1: Japanese Unexamined Patent Application Publication No. 11-331883;

Non-patent document 1: W. Yang et. al., "An Integrated 800.times.600 CMOS Image System," ISSCC Digest of Technical Papers, pp. 304-305, February, 1999;

Non-patent document 2: Kazuya YONEMOTO, "CCD/CMO Image Sensor no kiso to ouyo", CQ Publishing Co., Ltd, first edition p201-203, Aug. 10, 2003;

Non-patent document 3: Toshifumi IMAMURA, and Yoshiko YAMAMOTO, "3. Kosoku kinou CMOS image sensor no kenkyu", Internet
<URL:http://www.sankaken.gr.jp/project/iwataPJ/report/h12/h12in-dex.html>
on-line searched Mar. 15, 2004;

Non-patent document 4: Toshifumi IMAMURA, Yoshiko YAMAMOTO, and Naoya HASEGAWA "3. Koshoku kinou CMOS image sensor no kenkyu", Internet
<URL:http://www.sankaken.grjp/project/iwataPj/report/h12/h14ind-ex.html> on-line searched Mar. 15, 2004; and Non-patent document 5: Oh-Bong Kwon et. al., "A Novel Double Slope Analog-to-Digital Converter for a High-Quality 640.times.480 CMOS Imaging System," VL3-03 1999 IEEE p. 335-338.

The A/D conversion mechanisms disclosed in these documents have difficulty in terms of the size and area of a circuit, power consumption, the number of interfacing lines with another functional block, noise picked up by the lines, and current consumption.

FIG. 6 illustrates a known CMOS solid-state image pickup device 1 (CMOS image sensor) having an A/D converter and a pixel area mounted on the same semiconductor substrate. As shown in FIG. 6, the solid-state image pickup device 1 includes a pixel array (image pickup area) 10 having a plurality of unit pixels 3 arranged in a matrix, a driver 7 arranged outside the pixel array 10, a counter (CNT) 24, a column processor 26 including a column A/D converter 25 arranged on a per column basis, a reference signal generator 27 including a DAC (digital-to-analog converter) for supplying a reference voltage for D/A conversion to the column A/D converter 25 in the column processor 26, and an output circuit 28 including a subtracter 29.

The driver 7 includes a horizontal (row) scanning circuit 12 for controlling column addresses and column scanning, a vertical (row) scanning circuit 14 for controlling row addresses and row scanning, and a timing controller 21 for receiving a master clock CLK0 via a terminal 5a, and for generating a variety of internal clocks to control the horizontal scanning circuit 12 and the vertical scanning circuit 14.

Each unit pixel 3 is connected to a row control line 15 controlled by the vertical scanning circuit 14 and a vertical signal line 19 for transferring a pixel signal to the column processor 26.

The column A/D converter 25 includes a voltage comparator 252 and a data memory 255. The voltage comparator 252 compares a reference voltage RAMP generated by the reference signal generator 27 with an analog pixel signal obtained via the vertical signal line 19 (V0, V1, ... ) from the unit pixel 3 on a per row control line 15 (H0, H1, ... ). The data memory 255 includes latches (flipflops) as a memory for storing a count of the counter 24 that counts time until the voltage comparator 252 completes the comparison process. The column A/D converter 25 has a function of n bit A/D conversion. The data memory 255 includes a latch 1 and a latch 2, each having n bit capacity, as an independent internal memory area.

The ramp reference voltage RAMP generated by the reference signal generator 27 is commonly fed to input RAMP terminals of the voltage comparators 252 while respective pixel signal voltages from the pixel array 10 are supplied to the other terminals of the voltage comparators 252 connected to the vertical signal lines 19 of the corresponding column lines. The output of the voltage comparator 252 is supplied to the data memory 255.

The counter 24 performs a count process in accordance with a count clock CLK0 corresponding to the master clock CK0 (both clocks having the same clock frequency). The counter 24 thus outputs count output CK1, CK2, ... , CKn together with the count clock CK0 to each column A/D converter 25 in the column processor 26.

The lines for the count outputs CK1, CK2, ... , CKn from the counter 24 are routed to the latches of the data memory 255 arranged for each column. The column A/D converter 25 thus operates commonly in response to the single counter 24.

The output of the column A/D converter 25 is connected to a horizontal signal line 18. The horizontal signal line 18 include signal lines covering 2n bit width, and is connected to the subtracter 29 in the output circuit 28 via 2n sense circuits (not shown) corresponding to the output lines of the horizontal signals of the horizontal signal line 18. Video data D1 output from the output circuit 28 is output to the outside via an output terminal 5c from the solid-state image pickup device 1.

FIG. 7 is a timing diagram illustrating operation of the solid-state image pickup device 1 of FIG. 6.

The count of the counter 24 is reset to an initial value "0" for a first reading operation. After the first reading from the unit pixel 3 of any row Hx to the vertical signal line 19 (V0, V1, ... ) is stabilized, the reference voltage RAMP that is ramped in time axis by the reference signal generator 27 is input. The voltage comparator 252 compares the reference voltage RAMP with a pixel signal voltage of any vertical signal line 19 (column number Vx).

The counter 24 starts counting a conversion time of the voltage comparator 252 at the moment the reference voltage RAMP is inputted to the one terminal RAMP of each of the voltage comparator 252. In synchronization with the ramp waveform voltage issued from the reference signal generator 27 (time t10), the counter 24 starts down-counting from the initial value "0" in a first counting operation.

The voltage comparator 252 compares the ramp reference voltage RAMP from the reference signal generator 27 with a pixel signal voltage Vx input via the vertical signal line 19. When both voltages become equal to each other, the voltage comparator 252 inverts the comparator output from a high level to a low level (at time t12).

At about the same time as the inversion of the comparator output, the data memory 255 latches in the latch 1 thereof the count outputs CK1, CK2, ... , CKn from the counter 24 in response to the comparison time in synchronization with the count clock CK0. A first conversion operation is thus complete (at time t12).

When a predetermined down-count period has elapsed (at time t14), the timing controller 21 stops supplying control data to the voltage comparator 252 and supplying the count clock CK0 to the counter 24. The voltage comparator 252 thus stops the comparison operation thereof.

During the first reading operation, a reset component .DELTA.V of the unit pixel 3 is read. The reset component .DELTA.V contains noise varying from unit pixel 3 to unit pixel 3 as an offset. The variations of the reset component .DELTA.V is typically small, and a reset level is common to all pixels. The output of any vertical signal line 19 (Vx) is largely known.

The comparison period during the first reading of the reset component .DELTA.V is shortened by adjusting the reference voltage RAMP. In this known example, the reset component .DELTA.V is adjusted within a count period of 7 bits (128 clocks).

In the second reading operation, a signal component Vsig responsive to an amount of incident light per unit pixel 3 is read in addition to the reset component .DELTA.V, and the same operation as in the first reading operation is performed.

The count of the counter 24 is reset to "0" for a second reading operation. After the second reading from the unit pixel 3 of any row Hx to the vertical signal line 19 (V0, V1, ... ) is stabilized, the reference voltage RAMP that is ramped in time axis by the reference signal generator 27 is input. The voltage comparator 252 compares the reference voltage RAMP with a pixel signal voltage of any vertical signal line 19 (column number Vx).

The counter 24 starts counting a conversion time of the voltage comparator 252 at the moment the reference voltage RAMP is inputted to the one terminal RAMP of each of the voltage comparator 252. In synchronization with the ramp waveform voltage issued from the reference signal generator 27 (time t20), the counter 24 starts down-counting from the initial value "0" in a second counting operation.

The voltage comparator 252 compares the ramp reference voltage RAMP from the reference signal generator 27 with a pixel signal voltage Vx inputted via the vertical signal line 19. When both voltages become equal to each other, the voltage comparator 252 inverts the comparator output from a high level to a low level (at time t22).

At about the same time as the inversion of the comparator output, the data memory 255 latches the count outputs CK1, CK2, ... , CKn from the counter 24 in response to the comparison time in synchronization with the count clock CK0. A second conversion operation is thus complete (at time t22).

The data memory 255 latches the first count and the second count in a different location thereof, i.e., the latch 2. During the second reading operation, the reset component .DELTA.V and the signal component Vsig of the unit pixel 3 are read.

When a predetermined down-count period has elapsed (time t24), the timing controller 21 stops supplying control data to the voltage comparator 252 and stops supplying the count clock CK0 to the counter 24. In this way, the voltage comparator 252 stops the comparison operation thereof.

At a predetermined timing (time t28) of the end of the second counting operation, the timing controller 21 instructs the horizontal scanning circuit 12 to read pixel data. In response, the horizontal scanning circuit 12 successively shifts a horizontal selection signal CH(i) to be supplied to the data memory 255 via a control line 12C.

The count stored in the data memory 255, namely, the digital pixel data of n bits for the first and second reading operations, is successively output to the subtracter 29 in the output circuit 28 outside the column processor 26.

The n-bit subtracter 29 subtracts the first pixel data representing the reset component .DELTA.V of the unit pixel 3 from the second pixel data as a sum of the reset component .DELTA.V and the signal component Vsig of the unit pixel 3 at each pixel position, thereby determining the signal component Vsig of the unit pixel 3.

The same operation is repeated. The output circuit 28 results in a video signal representing a two-dimensional image.

In the above-described known technique, the counter 24 is commonly used by the column A/D converters 25 of all columns. Each memory of the data memory 255 needs to store the first count and the second count. The data memory 255 uses a pair of n-bit latches for n bit signals (namely, 2n latches for each bit), thereby requiring a large circuit area. This problem is hereinafter referred to as a first problem.

Not only the line for the synchronization count clock CK0 but also the lines for the count outputs CK1, CK2, . . . , CKn from the counter 24 need to be routed to the latches 1 and 2 of the data memory 255. Because of this routing, an increase in noise and an increase in power consumption become a concern. This problem is hereinafter referred to as a second problem.

Since the first count and the second count are stored in the different locations in the data memory 255, 2n signal lines are required to transfer the count results to the data memory 255, and currents involved increase accordingly. This problem is hereinafter referred to as a third problem.

The output circuit 28 subtracts the first count from the second count prior to the signal output, and 2n signal lines for transferring the count to the n bit subtracter 29 in the output circuit 28 at each time are required. An increase in noise and an increase in power consumption due to data transfer become a concern. This problem is hereinafter referred to as a fourth problem.

A memory for storing the first read results and a memory storing the second read results need to be separately arranged in addition to the counter, in other words, two memories are required. Signal lines for transferring the n-bit count from the counter to the memories are required. Further, 2n bit signal lines for transferring the first count and the second count, each count being n bits, to the subtracter are also required. The circuit scale and the circuit area are increased, leading to increases in noise, current consumption and power consumption.

In a pipeline arrangement that permits the A/D conversion and the reading process to be performed in parallel, a memory for storing A/D converted data is required in addition to a memory for storing the count results. As in the first problem, two memory systems are required, leading to an increase in the circuit area. This problem is hereinafter referred to a fifth problem.

To overcome the first problem, the previously quoted non-patent document 2 has proposed a column A/D converter. The column A/D converter performs a correlated double sampling (CDS) function and an A/D conversion function by cascading a counter commonly used for vertical columns with a CDS processing unit and a latch for latching the count of the counter arranged for each column.

To overcome the second problem, the previously quoted patent document 1 and non-patent documents 3-5 have proposed an arrangement in which a counter is arranged on a per column basis in the column processor 26 to perform the A/D function.

An A/D converter disclosed in the non-patent document 2 includes a counter for performing a parallel process on the vertical signal lines (for the vertical columns) and an A/D circuit using a latch, and calculates a difference between a reset component and a signal component. The A/D converter thus converts the input signal into digital data while suppressing fixed pattern noise of the pixels. With this arrangement, no subtraction process is required, and a single count process is sufficient. The memory for storing A/D converted data is constructed of a latch, thereby avoiding an increase in circuit area. In other words, the first, third, fourth, and fifth problems are overcome.

Since the counter is commonly shared by all vertical column lines in the same way as show in FIG. 6, n lines for the count outputs CK1, CK2, . . . , CKn from the counter are needed. The second problem is not solved.

In accordance with the technique disclosed by the non-patent documents 3 and 4, currents from a plurality of pixels for detecting light are outputted to an output bus, and summing and subtraction operations are performed on the currents on the bus. The resulting signal is converted in a pulse-width signal having a length in time direction. The number of clocks responsive to the pulse width of the pulse-width signal are counted in counters arranged in parallel to perform A/D conversion. This arrangement eliminates the need for the wiring for the counter output. In other words, the second problem is solved.

However, there is no mention about the handling of a reset component and a signal component, and it is not certain that the technique disclosed in the non-patent documents 3 and 4 solves the first, third, fourth, and fifth problems. Likewise, the non-patent documents 1 and 5 also fail to state how a reset component and the signal component are handled.

In contrast, the patent document 1 discloses the manner of handling of a reset component and a signal component. Using a correlated double sampling unit, a subtraction process for subtracting digital data of the signal component from digital data of the reset component is performed every vertical column. Voltage data of pure image is thus extracted from the reset component and the signal component. The fourth problem is thus solved.

With the technique disclosed in the patent document 1, a count signal is generated in a count process by an external system interface. One pair of buffers arranged for each vertical column stores a count at the moment the voltage of one of a reset component and a signal component matches a reference voltage in a comparison process. The arrangement of the A/D conversion is identical to the technique disclosed in the non-patent document 1 in that a single counter is commonly shared by all vertical column lines. The first, second, third, and fifth problems remain unsolved.

SUMMARY OF THE INVENTION

Accordingly, it is an object of the present invention to provide a mechanism to solve at least one of the previously described problems.

The present invention in a first aspect relates to a method for analog-to-digital converting, into digital data, a difference signal component, between a standard component and a signal component, of an analog signal to be processed containing the standard component and the signal component. A signal corresponding to one of the standard component and the signal component is compared with a reference signal for generating the digital data. A counting operation is performed in one of a down-count mode and an up-count mode in parallel with the comparison operation, and then the resulting count at the moment the comparison operation is completed is stored. The count mode is switched depending on whether the comparison operation is performed on the standard component or the signal component.

In a first step, the reference signal for generating the digital data is compared with one of the standard component and the signal component, different in physical property, of a single signal to be outputted from the same unit element such as a pixel and to be processed. The counting operation is performed in one of the down-count mode and the up-count mode in parallel with the comparison operation. The count at the moment the comparison operation is completed is stored.

In a second step, the reference signal is compared with the other of the standard component and the signal component. The counting operation is performed in the other of the down-count mode and the up-count mode. The count at the moment the comparison operation is completed is stored. The count stored subsequent to the second step is a difference from the first count. By performing the second counting operation with the count mode switched, the second count is obtained as a digital value corresponding to the difference between the standard component and the signal component.

The signal component to be processed in the second step indicates a true signal component in the signal to be processed, and does not necessarily mean the true signal component itself. In practice, a signal to be processed containing a noise component or a reset component is perfectly acceptable.

The standard component and the signal component are relative values, and a difference component between the standard component and the signal component is a difference between two signal components different in physical property of a single signal outputted from the same unit element such as the same pixel.

In the comparison operation of the standard component and the signal component, each of signals corresponding to the standard component and the signal component is compared with the reference signal that varies in a predetermined slope to detect a point where the signals corresponding to the standard component and the signal component matches the reference signal. The predetermined slope is not limited to a constant slope. The slope may vary from one value to next in a stepwise manner among a plurality of values so that the larger the signal component the larger the slope. In this arrangement, dynamic range is increased.

The counting operation is performed by counting a count clock from the point of generation of the reference signal used in the comparison operation to the point where the signal corresponding to one of the standard component and the signal component. The count responsive to the magnitude of one of the standard component and the signal component.

A common up-down counter may be used to perform the counting operation by switching between the down-count mode and the up-count mode. The counter circuit is thus made compact. With the two count modes switchably used, a subtraction process between the standard component and the signal component is directly performed. No dedicated subtractor is required to determine the difference between the standard component and the signal component.

The counting operation in the second step is preferably started with the count stored in the first step. The count stored subsequent to the second step becomes a digital value equal to a difference between the signal component and the standard component.

The comparison operation and the down-count operation are performed on the standard component in the first step and the comparison operation and the up-count operation are performed on the signal component in the second step. In this way, the count held subsequent to the second step becomes a digital value obtained as a result of subtracting the standard component from the signal component.

If the signal component appears subsequent to the standard component in time axis in the signal derived from the unit element such as the pixel, the second step is performed on the signal composed of the standard component and the signal component. The count held subsequent to the second step represents the signal component of the unit element.

Preferably, one of the first step and the second step is performed on the standard component in the down-count mode, and the other of the first step and the second step is performed on the signal component in the up-count mode. The count held after the two steps is a positive digital value as a result of subtracting the standard component from the signal component.

The comparison operation and the down-count operation are performed on the standard component in the first step and the comparison operation and the up-count operation are performed on the signal component in the second step. In this way, the count held subsequent to the second step becomes a digital value having a positive value obtained as a result of subtracting the standard component from the signal component. If the signal of the unit element contains the standard component and the signal component appearing subsequent to the standard component in time axis, digital data representing an effective signal component of the unit element is obtained as a positive value.

In the comparison of the standard component with the signal component, the standard component is largely constant and the amount of the standard component is small. The signal component is a variable component obtained when an electromagnetic wave such as light is detected by the unit element such as a pixel. The maximum amount of the signal component becomes large. Preferably, the maximum period of the comparison operation for the standard component is set to be shorter than the maximum period of the comparison operation of the signal component so that the total of the two A/D conversion periods is shortened.

Preferably, the count stored in the second step in connection with one signal processed in a preceding cycle of the first step and the second step is stored in another data memory, and when the first step and the second step are performed on the other signal to be processed a current cycle, the count is read from the other data memory in parallel.

Preferably, the signal to be processed contains an analog unit signal generated and output in the direction of columns by a unit signal generator in a semiconductor device for detecting a distribution of a physical quantity, wherein the semiconductor device includes a matrix of unit elements, each unit element including a charge generator for generating a charge corresponding to an input electromagnetic wave, and the unit signal generator for generating the analog unit signal corresponding to the charge generated by the charge generator.

When the unit elements are arranged in a two-dimensional matrix, the analog unit signal generated and outputted in the direction of columns by the unit signal generator is accessed and scanned on a per row basis (on column parallel). The first step and the second step are performed on each unit element on a per row basis, thereby speeding up the reading process and the A/D conversion process of the unit signal.

The present invention in a second aspect relates to a converter for analog-to-digital converting, into digital data, a difference signal component, between a standard component and a signal component, of an analog signal to be processed containing the standard component and the signal component. The converter includes a comparator for comparing a signal corresponding to each of the standard component and the signal component with a reference signal for generating the digital data, and a counter for performing a counting operation in one of a down-count mode and an up-count mode in parallel with the signal comparison operation performed by the comparator and for storing the resulting count at the moment the comparison operation is completed.

Preferably, the converter includes a controller for switching the count mode of the counter depending on whether the comparator performs the comparison operation on the standard component or the signal component.

The counter may include a counting circuit that switchably performs the counting operation between an up-count mode and a down-count mode. The counter may include a down-counter that performs the counting operation in the down-count mode and an up-counter that performs the counting operation in the up-count mode. In the latter case, the counter may further include an adder circuit that sums the count of the down-counter and the count of the up-counter.

Each of a semiconductor and an electronic apparatus of the present invention performs the above-referenced A/D conversion method, and is identical in structure to the above-referenced A/D converter.

In accordance with the semiconductor device of the present invention, a plurality of A/D converters, each including a comparator and a counter, are arranged in the direction of columns and rows of the unit elements.

Preferably, the comparator captures the analog unit signal generated and output in the direction of columns by the unit signal generator on a per row basis, and the comparator and the counter perform respective processes for each unit element on a per row basis. Preferably, the unit signal generator includes a semiconductor element for amplification.

Preferably, the charge generator includes a photoelectric conversion element that receives light as an electromagnetic wave and generates a charge responsive to the received light. With this arrangement, the semiconductor device is arranged as a solid-state image pickup device.

In accordance with the present invention, the reference signal for the A/D conversion is compared with the signal to be processed containing the standard component and the signal component, and the counting operation is performed in one of the down-count mode and the up-count mode in parallel with the comparison operation. When the count at the end of the comparison operation is stored, the count mode is switched depending on whether the comparison operation is performed on the standard component or the signal component.

In this way, the digital data representing the difference between the standard component and the signal component is obtained as a result of the counting operation of the two modes, namely, the down-count mode and the up-count mode.

The function of the memory storing the counts of the standard component and the signal component is performed by a latch owned by the counter. This arrangement eliminates the need for arranging a dedicated memory for storing the A/D converted data separate from the counter. The problem of increases in circuit size and circuit area is thus solved.

Since the A/D converter is composed of the comparator and the counter regardless of whether the common up-down counter is used, the counting operation is controlled by a single count clock line for operating the counter regardless of the number of bits and a control line for switching the count mode. Signal lines for transferring the count of the counter to the memory are thus eliminated. This arrangement overcome the problem of an increase in noise level and an increase in power consumption.

The up-down counter is commonly used with the count mode switched. The subtraction operation is directly performed by the counter. No dedicated subtracter is required for determining the difference between the standard component and the signal component. Also, this arrangement without the need for transferring the data to a subtracter avoids increases in noise level, current, and power consumption.

If the counter is composed of a down-counter and an up-counter, the count reached at the first step is set prior to the second counting operation. The subtraction operation between the standard component and the signal component is directly performed. No dedicated subtracter is required for determining the difference between the standard component and the signal component. Also, this arrangement without the need for transferring the data to a subtracter avoids increases in noise level, current, and power consumption.

When the counter is composed of a down-counter and an up-counter, the counting operation may be started with zero rather with the count reached at the first step. In such a case, an adder is required. Since the adder is arranged in each A/D converter containing the comparator and the counter, a length of line to the adder is shortened. Increases in noise level, current, and power consumption are still controlled.

The A/D converter is composed of the comparator and the counter in pair. When the unit signal outputted by the semiconductor device having an array of unit elements is to be processed, each of a plurality of A/D converters arranged in the direction of rows (the direction of an array of unit element columns) are provided with a counter. This arrangement eliminates the need for routing the output lines of the counter to the latch as shown in FIG. 6, thereby avoiding the problem of increases in noise level and power consumption.

In a pipeline operation in which the A/D conversion process and the reading process are performed in parallel, a single memory for storing the A/D converted data for each A/D converter is sufficient. An increase in the circuit area is minimized.

DESCRIPTION OF THE PREFERRED EMBODIMENTS

The embodiments of a CMOS solid-state image pickup device in accordance with the present invention are described below with reference to the drawings. The CMOS solid-state image pickup device is one example of X-Y addressing solid-state image pickup devices. All pixels of the CMOS solid-state image pickup device are constructed of NMOS.

The present invention is not limited to the image pickup device of MOS type. All embodiments described later are applicable to any semiconductor device for detecting physical property, including a line or a matrix of unit elements responsive to an electromagnetic wave, such as light or a radiation ray, inputted from the outside.

Figure 1:
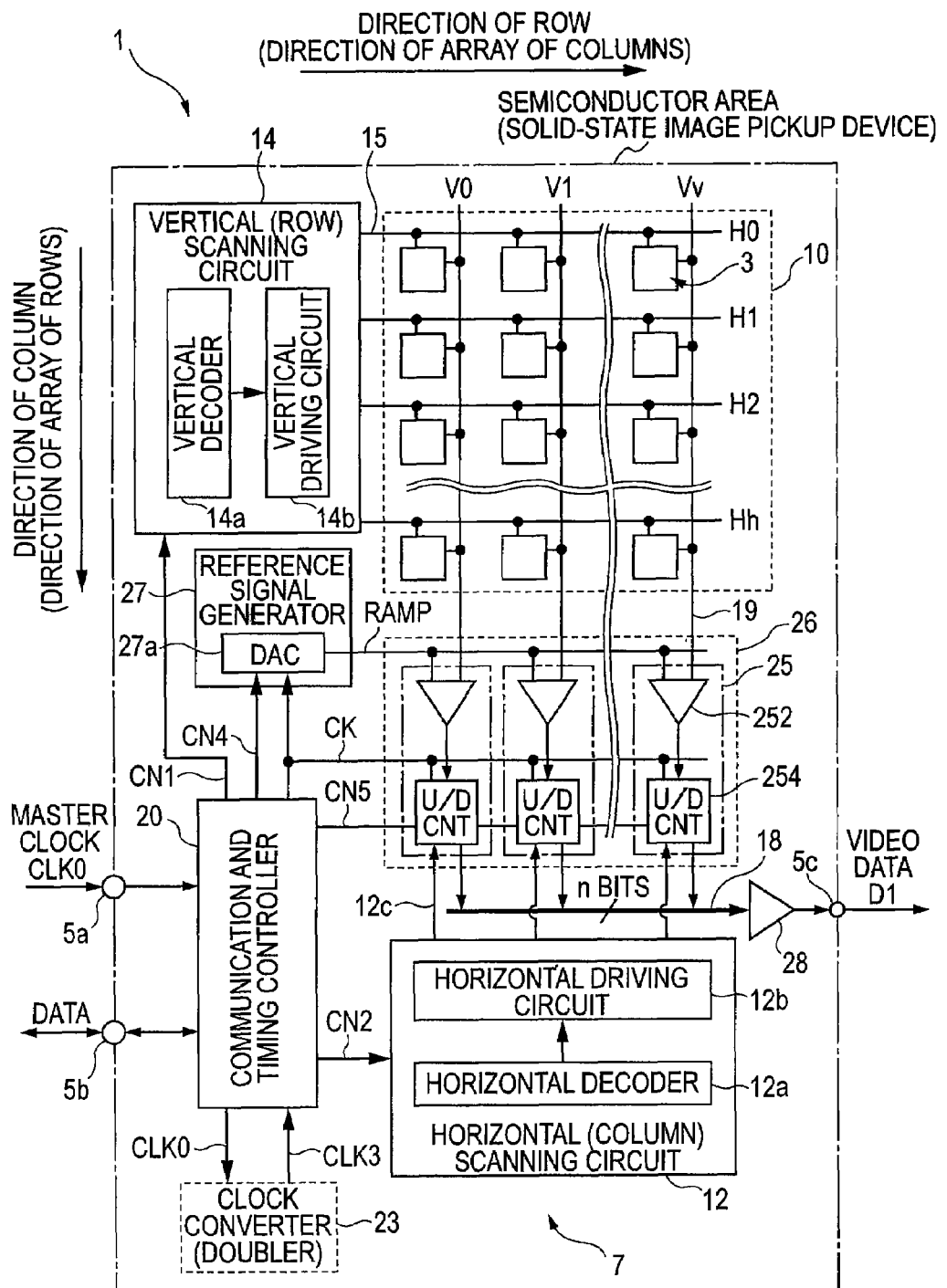
FIG. 1 is a block diagram of a circuit of a CMOS solid-state image pickup device in accordance with a first embodiment of the present invention.

FIG. 1 illustrates a CMOS solid-state image pickup device (CMOS image sensor) 1 in accordance with a first embodiment of the present invention. The CMOS solid-state image pickup device 1 is one example of an electronic apparatus of the present invention.

The solid-state image pickup device 1 includes a pixel section having a two-dimensional matrix of pixels, each pixel forming a light receiving element (as one example of a charge generator) that outputs a voltage signal responsive to an input amount of light, and correlated double sampling (CDS) units and analog-to-digital (A/D) converters arranged in a column parallel fashion.

The "arrangement in the column parallel fashion" means that a plurality of CDS units and a plurality of A/D converters are arranged in parallel with respective vertical signal lines 19. The plurality of these elements may be arranged on one edge of the columns of pixels in the pixel array 10 (i.e., on the output side at the lower side of the pixel array 10 as shown in FIG. 1) or may be arranged on both one edge of the columns of pixels in the pixel array 10 (i.e., on the output side at the lower side of the pixel array 10 as shown in FIG. 1) and the other edge of the columns of the pixels in the pixel array 10 (i.e., on the upper side of the pixel array 10). In the latter case, horizontal scanning units for scanning the pixels in the direction of rows (horizontal scanning) may be arranged on both lateral sides of the pixel array 10 in a manner that allows the two horizontal scanning units operate separately.

In a typical column parallel arrangement, each CDS unit and A/D converter are arranged on a per vertical column basis in a column area in an output portion of the image pickup device, and signals are successively outputted to an output side of the device. The present invention is not limited to the column type. For example, a single CDS unit and a single A/D converter are assigned to a plurality of adjacent vertical signal lines 19 (for example, a pair of adjacent vertical signal lines 19), or N vertical signal lines 19 (N is an positive integer number).

In any types other than the column type, a single CDS unit and a single A/D converter are shared by a plurality of vertical signal lines 19, and a switch circuit is arranged to selectively feed one of pixel signals of a plurality of columns from the pixel array 10 to the corresponding A/D converter. Depending on a subsequent process, a memory storing an output signal may be required.

A single CDS unit and a single A/D converter are shared by a plurality of vertical signal lines 19 in this way. Signal processing is performed each pixel signal after the pixel signal is read on a per pixel column basis. In comparison with the case in which signal processing is performed in each unit pixel, simple structure of each unit pixel, multiple pixel design, miniaturization, and low cost design are easy to implement.

Since pixel signals at one row are processed concurrently in parallel in a plurality of signal processors arranged in a column parallel fashion, signal processing is permitted to be operated at a speed slower than in the arrangement in which a single CDS unit and a single A/D converter outside an output circuit and a device. This is advantageous in terms of power consumption, bandwidth performance, and noise. Given the same power consumption and the bandwidth, the entire sensor is permitted to operate faster.

The column type device, which is permitted to operate a slow speed, is advantageous not only in power consumption, bandwidth performance, and noise, but also in design free from a switch circuit. Unless otherwise noted in the following description, the solid-state image pickup device is the column type.

As shown in FIG. 1, the solid-state image pickup device 1 of the first embodiment includes pixel array 10 having a plurality of unit pixels 3 arranged in a matrix, a driver 7 arranged outside the pixel array 10, a column processor 26, a reference signal generator 27 for feeding a reference voltage for A/D conversion to the column processor 26, and an output circuit 28.

As necessary, an automatic gain control (AGC) circuit having a signal amplification function may be arranged in front of or at the back of the column processor 26 in the same semiconductor area. The AGC circuit, if arranged in front of the column processor 26, performs an analog amplification. The AGC circuit, if arranged at the back of the column processor 26, performs a digital amplification. If n-bit digital data is merely amplified, gradation of the data can be destroyed. It is therefore preferred to perform the A/D conversion after the analog amplification.

The driver 7 has a control circuit function for successively reading a signal from the pixel array 10. The driver 7 includes a horizontal (column) scanning circuit 12 for controlling column addresses and column scanning, a vertical (row) scanning circuit 14 for controlling row addresses and row scanning, and a communication and timing controller 20 for generating internal clocks.

A clock converter 23 enclosed in a broken-lined box may be arranged as shown near the communication and timing controller 20 in FIG. 1. The clock converter 23 as an example of a high-speed clock generator generates a pulse having a higher clock frequency than a clock frequency of a signal input thereto. The communication and timing controller 20 generates the internal clocks in response to an input clock (master clock) CLK0 inputted via a terminal 5a or a high-speed clock generated by the clock converter 23.

The use of the high-speed clock generated by the clock converter 23 allows the A/D conversion process to be executed at a fast speed. With the high-speed clock, an extraction process and a compression process, each requiring high-speed calculations, can be performed. Parallel data outputted from the column processor 26 can be converted into serial data to be outputted outside the device as video data D1. In this way, the video data is outputted at terminals less than terminals equal to the number of bits of the A/D converted digital data.

The clock converter 23 includes a frequency multiplier circuit for generating a pulse having a clock frequency higher than a clock frequency of the input clock. Upon receiving a low-speed clock CLK2 from the communication and timing controller 20, the clock converter 23 generates a clock having a frequency at least twice the low-speed CLK2. The frequency multiplier circuit of the timing controller 21 is a k1 multiplier circuit, where k1 represents the frequency of the low-speed clock CLK2. The k1 multiplier circuit can be any of known circuits.

Although columns and rows of the pixels are partially shown in FIG. 1, unit pixels 3 of tens to several thousands are arranged in practice. The unit pixel 3 typically includes a photodiode, such as a light receiving element (charge generator), and a pixel amplifier including an amplifying semiconductor element (such as a transistor).

The pixel amplifier may have a floating diffusion amplifier structure. The charge generator typically includes commercially available four transistors as a CMOS sensor, namely, a read and selection transistor functioning as a charge reader (a transfer gate section/a read section), a reset transistor functioning as a reset gate, a vertical selection transistor, and an amplifying source-follower transistor functioning as a detector element for detecting a voltage change in floating diffusion.

The pixel amplifier may be composed of three transistors as disclosed in Japanese Patent No. 2708455. The pixel amplifier includes an amplifying transistor, connected to drain (DRN) line, for amplifying a signal voltage corresponding to a signal charge generated in a charge generator, a reset transistor for resetting the charge generator, a read and selection transistor (transfer gate) being scanned by a vertical shift transistor via transfer (TRF) line.

The driver 7 further includes the horizontal scanning circuit 12, the vertical scanning circuit 14, and the communication and timing controller 20. The horizontal scanning circuit 12 has a read and scanning function to read a count from the column processor 26. Along with the pixel array 10, the elements in the driver 7 are integrally produced on a semiconductor area such as a monocrystal silicon substrate into a solid-state image pickup device using the same technique as the semiconductor integrated circuit manufacturing process.

The unit pixel 3 is connected to the vertical scanning circuit 14 via a row control line 15 for selecting a row, and via vertical signal line 19 to the column processor 26 having a column A/D converter 25 arranged on a per vertical column basis. The row control line 15 represents all lines routed from the vertical scanning circuit 14 to the pixels.

Each of the horizontal scanning circuit 12 and the vertical scanning circuit 14, including a decoder, starts a shift operation (scanning) in response to control signals CN1 an CN2 provided by the communication and timing controller 20. The row control line 15 conducts a variety of pulse signals for driving the unit pixel 3 (such as a reset pulse RST, a transfer pulse TRF, a DRN control pulse DRN, etc.).

The communication and timing controller 20 includes a timing generator TG (as an example of a read address controller) for supplying clocks required for various operations and pulse signals having a predetermined timing and a communication interface for receiving the master clock CLK0 via the terminal 5a, and data DATA for instructing an operation mode via the terminal 5a, and for outputting data containing information relating to the solid-state image pickup device 1. The timing generator TG and the communication interface are not shown in FIG. 1.

A horizontal address signal is outputted to a horizontal decoder 12a, and a vertical address signal is outputted to a vertical decoder 14a. In response, the horizontal decoder 12a and the vertical decoder 14a select respective row and column.

The unit pixels 3 are arranged in a two-dimensional matrix, and vertical scanning for reading is performed by accessing the unit pixels 3 on a per row basis (in a column parallel fashion) to capture the analog pixel signal, generated by a pixel signal generator 5 and outputted via the vertical signal lines 19 in the direction of columns, and then horizontal scanning for reading is performed by accessing the unit pixels 3 in the directions of columns to read pixel signals (digital pixel data). The pixel signal and the pixel data are fast read. The reading operation is not limited to scanning. Random accessing for reading information of only a targeted unit pixel 3 can be performed by directly addressing the targeted unit pixel 3.

The communication and timing controller 20 of the first embodiment supplies to internal elements of the device including the horizontal scanning circuit 12, the vertical scanning circuit 14, and the column processor 26, a clock CLK1 having the same frequency as the master clock CLK0 supplied via the terminal 5a, and a low-speed clock that is obtained by frequency dividing the clock CLK1 by 2. Hereinafter, the divide-by-2 clock and other clocks having lower frequencies are collectively referred to as a low-speed clock CLK2.

The vertical scanning circuit 14 selects a row of the pixel array 10, and supplies that row with required pulses. The vertical scanning circuit 14 includes the vertical decoder 14a and a vertical driving circuit 14b. The vertical decoder 14a defines a read row in the vertical direction (selects a row of the pixel array 10). The vertical driving circuit 14b supplies pulses to the row control line 15, thereby driving the unit pixels 3 on the read address defined by the vertical decoder 14a. The vertical decoder 14a selects an electronic shutter in addition to the reading of the signal.

The horizontal scanning circuit 12 successively selects the column A/D converters 25 of the column processor 26 in synchronization with the low-speed clock CLK2, transferring the signal from the column A/D converter 25 to the horizontal signal line 18. The horizontal scanning circuit 12 includes a horizontal decoder 12a for defining a read column in the horizontal direction (selecting the column A/D converter 25 within the column A/D converter 25), and a horizontal driving circuit 12b for transferring the signal of the column processor 26 to the horizontal signal line 18. The horizontal signal line 18 includes n lines if the number of bits handled by the column A/D converter 25 is n bits, for example, 10 lines if the number of bits is 10.

In the solid-state image pickup device 1 thus constructed, the pixel signal outputted from the unit pixel 3 is supplied to the column A/D converter 25 in the column processor 26 via the vertical signal line 19 on a per vertical column basis.

The column A/D converter 25 in the column processor 26 processes the pixel signal of one column. For example, the column A/D converter 25 includes an A/D converting circuit for converting an analog signal into 10-bit digital data using the low-speed clock CLK2.

The A/D converting circuit to be discussed later in detail starts counting the clock signal in response to a reference voltage RAMP supplied to the voltage comparator 252 thereof, and compares the reference voltage RAMP with the analog pixel signal inputted via the vertical signal line 19. The A/D converting circuit performs A/D conversion by continuously counting until the pulse signal is obtained.

By introducing an appropriate circuit, a difference between a signal level (noise level) immediately subsequent to pixel resetting with respect to a pixel signal in a voltage mode inputted via the vertical signal line 19 and a true signal level Vsig responsive to an amount of light is determined. In this way, noise signal component such as a fixed pattern noise (FPN) and reset noise is thus removed.

The pixel data digitized by the column A/D converter 25 is transferred to the horizontal signal line 18 via a horizontal selection switch (not shown) driven by a horizontal selection signal, and then inputted to the output circuit 28. The number of bits of 10 is only an example. The number of bits may be any number above 10 (14 bits, for example).

Pixel signals are thus successively outputted on a per row basis from the pixel array 10 having a matrix of light receiving elements as a charge generator. A frame image corresponding to the pixel array 10 having the matrix of the photosensitive elements is thus obtained as a set of pixel signals of the whole pixel array 10.

The reference signal generator 27 includes a digital-to-analog (D/A) converter 27a. In synchronization with the count clock CK0, the reference signal generator 27 generates a ramp signal from the initial value represented by control data CN 4 from the communication and timing controller 20. The reference signal generator 27 then supplies the generated ramp signal as a reference voltage (A/D reference signal) for A/D conversion to each column A/D converter 25 in the column processor 26. A noise suppression filter (not shown) may also be arranged.

The ramp signal is varied faster by using the high-speed clock from the clock converter 23, for example, the frequency multiplied clock generated by the frequency multiplier in the clock converter 23, than by using the count clock CLK0.

The control data CN4 supplied from the communication and timing controller 20 to the D/A converter 27a in the reference signal generator 27 contains information for equalizing a rate of change of digital data with respect to time, namely, for equalizing the slope of the ramp voltage from comparison process to comparison process. More specifically, the digital data is varied one count per unit time.

The column A/D converter 25 having an n-bit A/D conversion function includes a voltage comparator 252 and a counter 254. The voltage comparator 252 compares the reference voltage RAMP generated by the D/A converter 27a in the reference signal generator 27 with the analog pixel signal supplied from the unit pixels 3 on a per row control line 15 (H0, H1, . . . ) via the vertical signal lines 19 (V0, V1, . . . ). The counter 254 counts time until the voltage comparator 252 completes the comparison operation, and stores the resulting count.

The communication and timing controller 20 switches the count mode of the counter 254 depending on whether the voltage comparator 252 performs the comparison operation on either the reset component .DELTA.V or the signal component Vsig of the pixel signal. A control signal CN5 is supplied from the communication and timing controller 20 to the counter 254 in the column A/D converter 25 to give the counter 254 an instruction of which count mode to perform, the down-count mode or the up-count mode.

The reference voltage RAMP generated by the reference signal generator 27 is fed to input terminals RAMP of the voltage comparators 252. The other input terminals of the voltage comparators 252, connected to respective vertical signal lines 19 of the vertical columns, receive individual pixel signal voltages from the pixel array 10. The output of the voltage comparator 252 is fed to the counter 254.

The communication and timing controller 20 supplies a count clock CK0 commonly to clock terminals CK of the counters 254.

Figure 6:
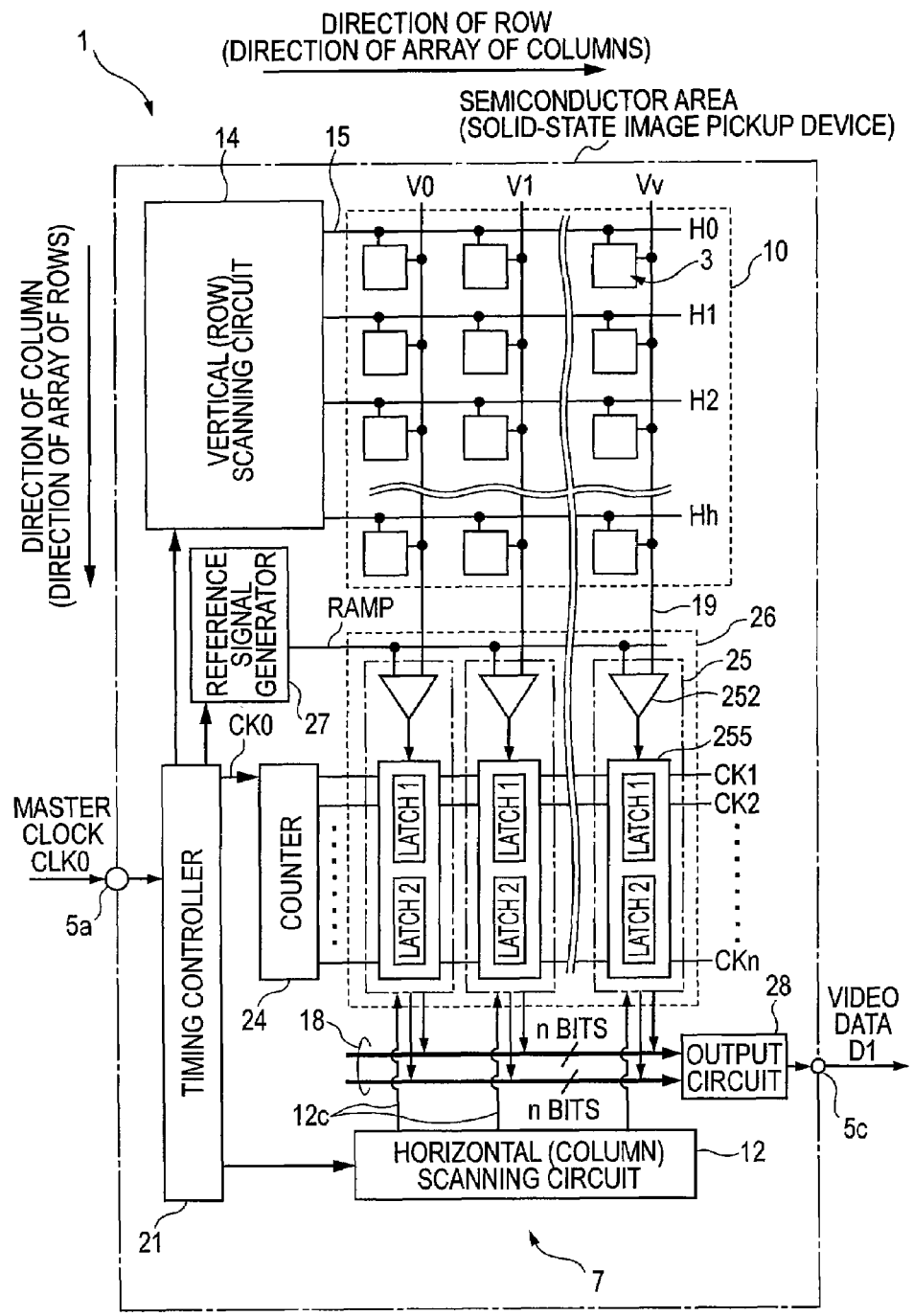
FIG. 6 is a block diagram of a known CMOS solid-state image pickup device having an A/D converter and a pixel section arranged on the same semiconductor substrate.
Figure 7:
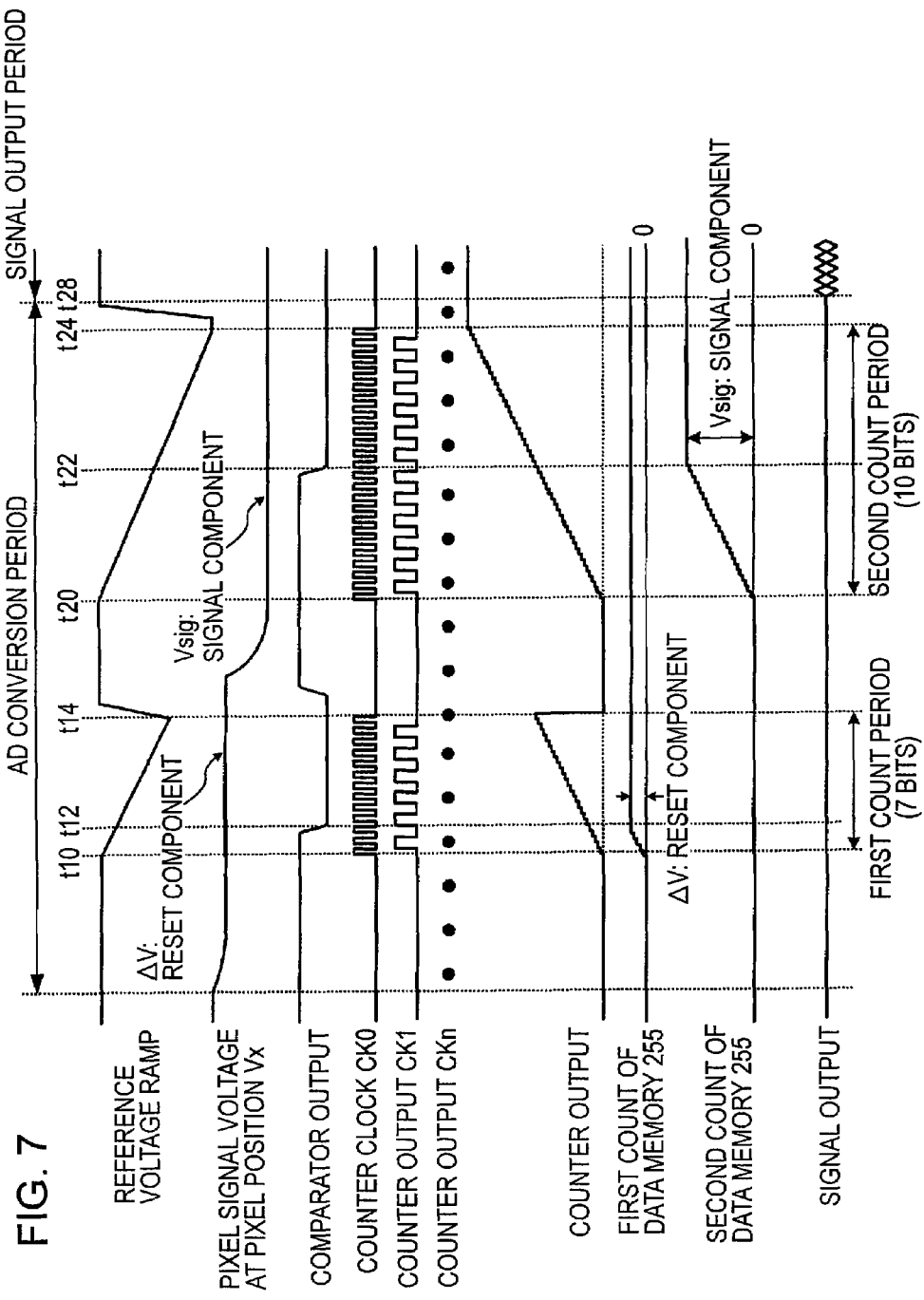
FIG. 7 is a timing diagram illustrating operation of the known solid-state image pickup device of FIG. 6.

The counter 254, although the structure thereof not shown here, is constructed by modifying the wiring of the data memory 255 having the latches as shown in FIG. 6 into a wiring for a synchronization counter. Internal counting is performed in response to the inputting of a single count clock CK0. As the ramp signal, the count clock CK0 is generated based on the high-speed clock (frequency-multiplied clock) from the clock converter 23, and thus faster than the master clock CLK0.

A combination of n latches forms the counter 254. As a result, the resulting circuit has half the size of the circuit of the data memory 255 having the two lines of n latches as shown in FIG. 6. Since the counter 24 is eliminated, the circuit becomes much more compact than the arrangement of FIG. 6.

The counter 254 of the first embodiment is an up-down counter (U/D CNT) that can be switched between the down-count mode and the up-count mode. The counter 254 of the first embodiment also is a synchronization counter type that outputs the count in synchronization with the count clock CK0.

In the synchronization counter, operation of all flipflops is controlled by the count clock CK0. If a higher frequency operation is required, an asynchronous counter is preferable as the counter 254. The asynchronous counter is appropriate for use in high-frequency range because the operational limiting frequency thereof is determined by a limiting frequency of only an initial-stage flip-flop.

A control pulse is fed from the horizontal scanning circuit 12 to the counter 254 via a control line 12c. The counter 254, having a latch function for latching the count thereof, stores the count until an instruction in the form of the control pulse is supplied via the control line 12c.

As previously discussed, the column A/D converters 25, each arranged for each vertical signal line 19 (V0, V1, . . . ), form the column processor 26 functioning as an A/D converter block.

The output of the column A/D converter 25 is connected to the horizontal signal line 18. The horizontal signal line 18 includes signal lines of n bits equal to the bit width of the column A/D converter 25. The horizontal signal line 18 is thus connected to the output circuit 28 via n sense circuits (not shown) corresponding to the horizontal signal line 18.

The column A/D converter 25 performs a count operation during a pixel signal read period corresponding to a horizontal blanking period, thereby outputting the counting result at a predetermined timing. The voltage comparator 252 compares the ramp voltage from the reference signal generator 27 with the pixel signal voltage input via the vertical signal line 19. If both voltages become equal in level, the voltage comparator 252 inverts the comparator output thereof from a high level to a low level in this embodiment.

The counter 254 has already started one of the down-counting operation and the up-counting operation in synchronization with the ramp voltage issued from the reference signal generator 27. Upon receiving the information of the inversion of the comparator output, the counter 254 stops the counting operation thereof, and latches the count at the moment as pixel data. The A/D conversion thus ends.

The counter 254 outputs the stored pixel data via the output terminal Sc outside the column processor 26 and the chip of the pixel array 10 in accordance with a shift operation caused by a horizontal selection signal CH(i) that is inputted from the horizontal scanning circuit 12 via the control line 12c at a predetermined timing.

Other signal processing circuits (not shown) unrelated to the first embodiment of the present invention may be contained in the solid-state image pickup device 1.

Figure 2:
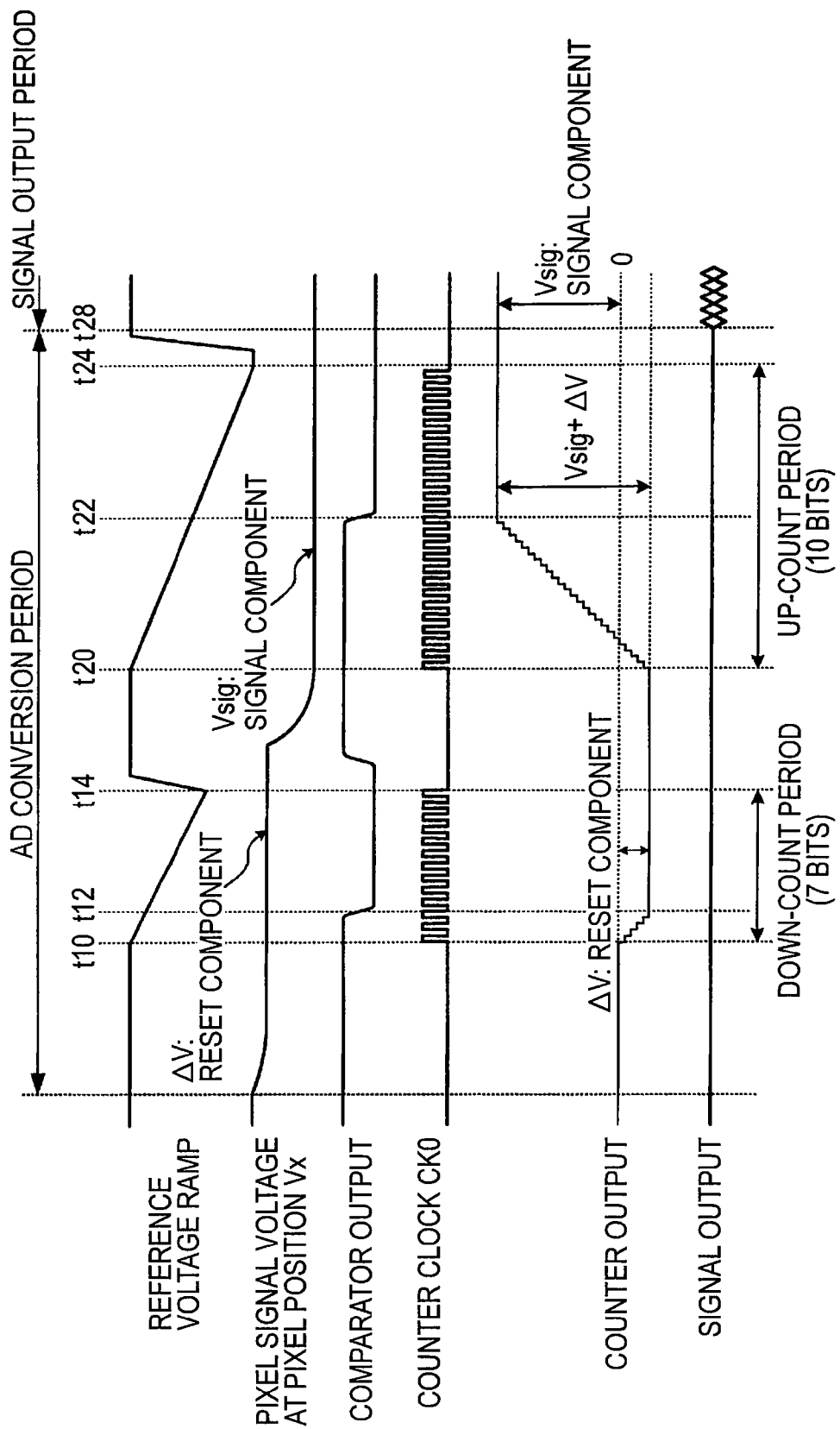
FIG. 2 is a timing diagram illustrating operation of a column A/D converter in the solid-state image pickup device of FIG. 1 in accordance with the first embodiment of the present invention.

FIG. 2 is a timing diagram illustrating operation of the column A/D converter 25 in the solid-state image pickup device 1 of FIG. 1 in accordance with the first embodiment of the present invention.

The analog pixel signal detected by each unit pixel 3 in the pixel array 10 is A/D converted as below. A point where the reference voltage RAMP that gradually falls at a predetermined slope matches the voltage of one of a standard component and a signal component of the pixel signal from the unit pixel 3 is detected. The count clock from the start of the generation of the reference voltage RAMP for use in the A/D conversion to the point where the reference signal matches the signal corresponding to one of the standard component and the signal component in the pixel signal is counted. The count responsive to the magnitude of the standard component or the signal component is thus obtained.

In the pixel signal output from the vertical signal line 19, the signal component Vsig appears subsequent to the reset component .DELTA.V containing noise of the pixel signal as the standard component. When a first process is performed on the standard component (reset component .DELTA.V), a second process is performed on the sum of the standard component (reset component .DELTA.V) and the signal component Vsig.

To perform first reading, the communication and timing controller 20 resets the count of the counter 254 to "0" while setting the counter 254 to the down-count mode. After the first reading from the any row Hx of the unit pixels 3 to the vertical signal line 19 (V0, V1, . . . ) becomes stabilized, the communication and timing controller 20 supplies the control data CN4 for generating the reference voltage RAMP to the reference signal generator 27.

In response, the reference signal generator 27 feeds the ramp waveform varied in time in a ramp shape to the RAMP terminals of the voltage comparators 252 as a comparison voltage. The voltage comparator 252 compares the comparison voltage having the ramp waveform with the pixel signal voltage supplied from the pixel array 10 via any vertical signal line 19 (Vx).

When the reference voltage RAMP is inputted to the input terminal RAMP of each of the voltage comparator 252, the counters 254 arranged at each row start counting the comparison time. In synchronization with the ramp shaped voltage issued from the reference signal generator 27 (time t10), the communication and timing controller 20 inputs the count clock CK0 to the clock terminal of the counter 254. In a first counting operation, the counter 254 starts down-counting with an initial value "0", namely, performing the counting operation in a negative direction.

The voltage comparator 252 compares the reference voltage RAMP from the reference signal generator 27 with the pixel signal voltage Vx input via the vertical signal line 19, and inverts the comparator output thereof from a high level to a low level (time t12) when the two voltages become equal. More specifically, the voltage comparator 252 compares the voltage signal responsive to the reset component Vrst with the reference voltage RAMP, thereby generating an active low pulse having a length in time axis corresponding to the magnitude of the reset component Vrst. The active low pulse is then supplied to the counter 254.

In response, the counter 254 stops the counting operation at about the same time as the inversion of the comparator output. The count at the moment is latched. The A/D conversion is thus complete (time t12). The width of the active low pulse signal having the length in time axis obtained as a result of the comparison operation by the voltage comparator 252 is counted with respect to the clock count CK0. The count responsive to the reset component Vrst is thus obtained.

At the moment a predetermined down-count period has elapsed (time t14), the communication and timing controller 20 stops the supply of the control data to the voltage comparator 252 and the supply of the count clock CK0 to the counter 254. In this way, the voltage comparator 252 stops the comparison operation.

During the first reading, the counting operation is performed by detecting the reset level Vrst of the pixel signal voltage Vx with the voltage comparator 252. As a result, the reset component .DELTA.V of the unit pixel 3 is read.

The reset component .DELTA.V contains noise varying from the unit pixel 3 to the unit pixel 3 as an offset. The variations in the unit pixel 3 are typically small, and the reset level Vrst is typically common to all pixels. The output value of the reset component .DELTA.V in the pixel signal voltage Vx of the any vertical signal line 19 is largely known.

During the first reading of the reset component .DELTA.V, a down-count period (comparison period from time t10 to time t14) can be shortened by adjusting the reference voltage RAMP. In this embodiment, the maximum length of the comparison operation for the reset component .DELTA.V is set to be a 7-bit count period (128 clocks).

During a second reading, the signal component Vsig responsive to an amount of input light to each unit pixel 3 is read in addition to the reset component .DELTA.V, and the same process as the first reading is performed. The communication and timing controller 20 sets the counter 254 to the up-count mode. When the second reading of the unit pixels 3 at any row Hx to the vertical signal line 19 (V0, V1, . . . ) is stabilized, the communication and timing controller 20 supplies the control data CN4 for generating the reference voltage RAMP to the reference signal generator 27.

In response, the reference signal generator 27 feeds the ramp waveform varied in time in a ramp shape to the RAMP terminals of the voltage comparators 252 as a comparison voltage. The voltage comparator 252 compares the comparison voltage having the ramp waveform with the pixel signal voltage supplied from the pixel array 10 via any vertical signal line 19 (Vx).

When the reference voltage RAMP is inputted to the input terminal RAMP of each of the voltage comparator 252, the counters 254 arranged at each row start counting the comparison time. In synchronization with the ramp shaped voltage issued from the reference signal generator 27 (time t20), the communication and timing controller 20 inputs the count clock CK0 to the clock terminal of the counter 254. In a second counting operation, the counter 254 starts up-counting with the count corresponding to the reset component .DELTA.V of the unit pixel 3 acquired during the first reading, namely, performing the counting operation in a positive direction.

The voltage comparator 252 compares the reference voltage RAMP from the reference signal generator 27 with the pixel signal voltage Vx inputted via the vertical signal line 19, and inverts the comparator output thereof from a high level to a low level (time t22) when the two voltages become equal. More specifically, the voltage comparator 252 compares the voltage signal responsive to the signal component Vsig with the reference voltage RAMP, thereby generating an active low pulse having a length in time axis corresponding to the magnitude of the signal component Vsig. The active low pulse is then supplied to the counter 254.

In response, the counter 254 stops the counting operation at about the same time as the inversion of the comparator output. The count at the moment is latched. The A/D conversion is thus complete (time t22). The width of the active low pulse signal having the length in time axis obtained as a result of the comparison operation by the voltage comparator 252 is counted with respect to the clock count CK0. The count responsive to the signal component Vsig is thus obtained.

At the moment a predetermined up-count period has elapsed (time t24), the communication and timing controller 20 stops the supply of the control data to the voltage comparator 252 and the supply of the count clock CK0 to the counter 254. In this way, the voltage comparator 252 stops the comparison operation.

During the second reading, the counting operation is performed by detecting the signal component Vsig in the pixel signal voltage Vx with the voltage comparator 252. As a result, the signal component Vsig of the unit pixel 3 is read.

In accordance with the first embodiment of the present invention, the counter 254 performs the down-counting operation in the first reading, and the up-counting operation in the second reading. The counter 254 thus automatically performs a subtraction process expressed by equation (1), and then stores the count as the subtraction result:

(Count in the second comparison)−(count in the first comparison) (1)

Equation (1) is also expressed as equation (2), and the count stored in the counter 254 as a result is the signal component Vsig as follows:

(Count in the second comparison)−(count in the first comparison)=(signal component Vsig+reset component .DELTA.V+offset component of the column A/D converter 25)−(reset component .DELTA.V L+offset component of the column A/D converter 25)=(signal component Vsig) (2)

The two reading operations and the subtraction process of the counter 254, such as the down-counting operation in the first reading and the up-counting operation in the second reading, removes the reset component .DELTA.V containing variations from the unit pixel 3 to the unit pixel 3 and the offset component of individual column A/D converters 25. Only the signal component Vsig responsive to the amount of input light is captured on a per unit pixel basis using a simple arrangement. Reset noise is also removed.

The column A/D converter 25 of the first embodiment functions not only as a D/A converter for converting the analog pixel signal into the digital data, but also as the CDS unit.

The count obtained in equation (2) shows that the pixel data has a positive value, and no complementary operation is required. The first embodiment of the present invention thus achieves high compatibility with an existing system.

In the second reading, the signal component Vsig responsive to the amount of incident light is read. To measure the level of the amount of incident light in a wide range, an up-count period (comparison period of t20 to t24) needs to be widened so that the ramp voltage to be supplied to the voltage comparator 252 varies greatly.

In accordance with the first embodiment, the maximum length of the comparison operation for the signal component Vsig is set to be a 10-bit count period (1024 clocks). In other words, the maximum length of the comparison process of the reset component .DELTA.V is set to be shorter than the comparison process of the signal component Vsig rather than being set to be equal to the comparison process of the signal component Vsig. As a result, the total length of the two A/D conversion operations is shortened.

Although the number of bits is different from the first comparison operation to the second comparison operation, the slopes (rates of change) of the reference voltages RAMP of the first and second comparison operations are set to be equal to each other. This equalization is performed by supplying digital data from the communication and timing controller 20 to the reference signal generator 27 so that the reference signal generator 27 generates the reference voltage RAMP based on the control data. Since the generation of the reference voltage RAMP is digitally controlled, the slopes of the first and second reference voltages RAMP are easily equalized. The accuracies of A/D conversions are set to be equal to each other, and the subtraction results of the up-down counter resulting from equation (1) are correctly obtained.

At a predetermined timing (time t28) after the completion of the second counting operation, the communication and timing controller 20 instructs the horizontal scanning circuit 12 to read the pixel data. In response, the horizontal scanning circuit 12 successively shifts the horizontal selection signal CH(i) to be supplied to the counter 254 via the control line 12c.

The count represented in equation (2) and stored in the counter 254, namely, n-bit digital data as the pixel data, is successively outputted from the column processor 26 or the chip housing the pixel array 10 via the output terminal Sc. The same process is repeated, thereby producing the video data D1 representing a two-dimensional image.

The solid-state image pickup device of the first embodiment uses the up-down counter with the count mode thereof switched, thereby performing the two counting operations. In the arrangement of the matrix of unit pixels 3, the column A/D converter 25 is constructed of a column parallel A/D circuit on a per vertical column basis.

The subtraction operation between the standard component (reset component) and the signal component is directly obtained on a per column basis as the result of the second counting. The memory function of storing the count results of the standard component and the signal component are performed by the latches in the counter. This arrangement eliminates the need for arranging a dedicated memory for storing the A/D converted data.

No dedicated subtracter for determining a difference between the standard component and the signal component is required. The scale and area of the circuit are reduced in comparison with the conventional art. Increases in noise, current, and power consumption are avoided.

Since the column processor 26 is composed of the voltage comparator 252 and the counter 254, the counting operation is controlled by the count clock line and the control line for operating the counter 254 regardless of the number of bits. Signal lines for transferring a count from a counter to a memory, required in the conventional art, are eliminated. Increases in noise and power consumption are thus avoided.

More specifically, the solid-state image pickup device 1 includes the column A/D converter 25 composed of the voltage comparator 252 and the counter 254. The counter 254 is switched between the down-count mode and the up-count mode to determine the difference digital data between the standard component (the reset component in the first embodiment) and the signal component. This arrangement prevents increases in circuit scale, circuit area, and power consumption, the number of interface wiring lines with another apparatus, and noise and power consumption caused by the interfacing wiring lines.

Figure 3:
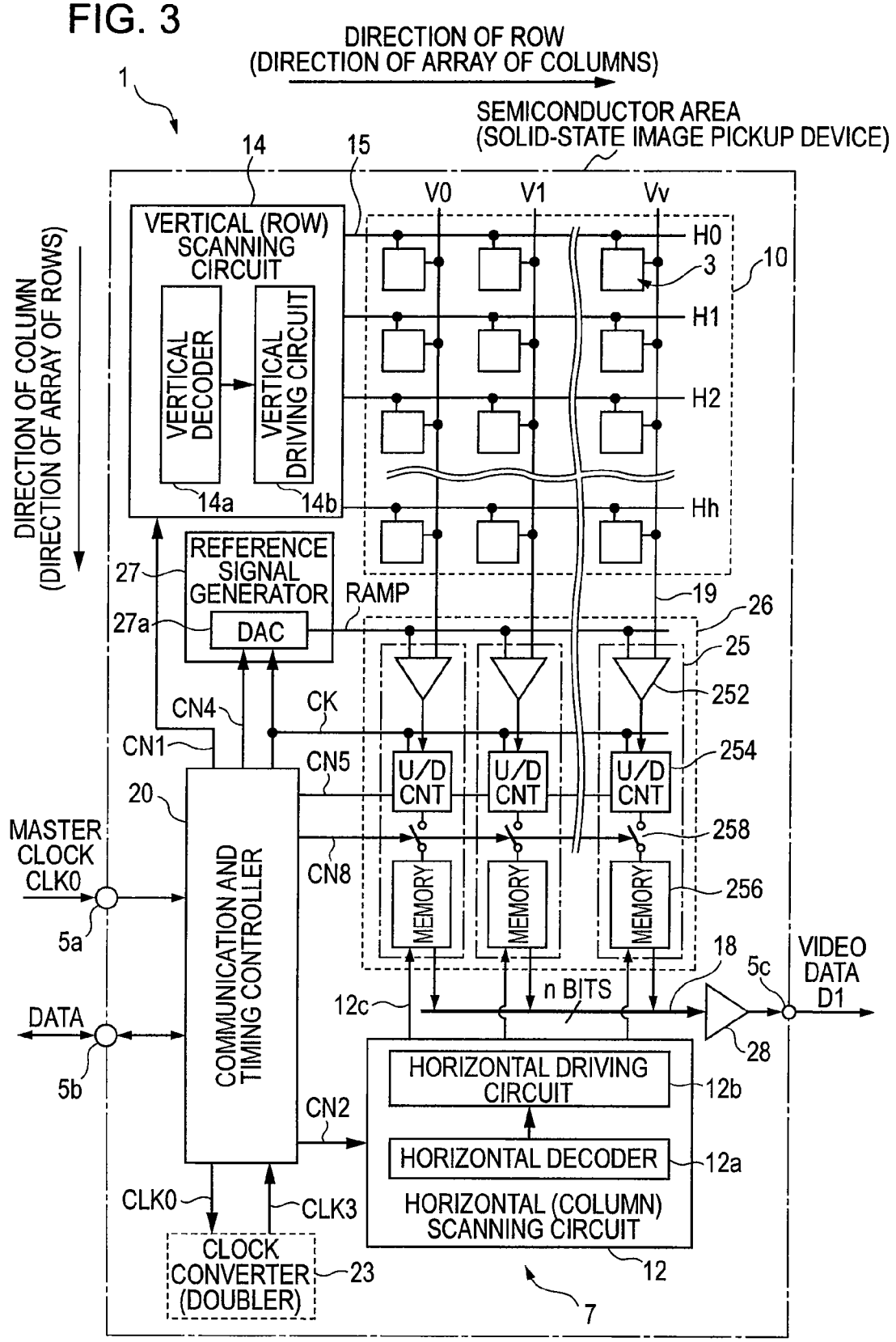
FIG. 3 is a block diagram of a CMOS solid-state image pickup device in accordance with a second embodiment of the present invention.

FIG. 3 illustrates a CMOS solid-state image pickup device in accordance with a second embodiment of the present invention. The solid-state image pickup device 1 of the second embodiment includes a modification in the column A/D converter 25 in the solid-state image pickup device 1 of the first embodiment of the present invention.

The column A/D converter 25 of the second embodiment includes a n-bit data memory 256, arranged in a subsequent stage to the counter 254, for storing the count result stored in the counter 254, and a switch 258 arranged between the counter 254 and the data memory 256.

The switches 258 are commonly supplied with a memory transfer command pulse CN8 as a control pulse at a predetermined timing by the communication and timing controller 20. Upon receiving the memory transfer command pulse CN8, the switch 258 transfers the count of the corresponding counter 254 to the data memory 256. The data memory 256 stores the incoming count.

The mechanism of storing the count of the counter 254 to the data memory 256 at a predetermined timing is not limited to the switch 258. For example, the counter 254 is directly connected to the data memory 256 and an output enable terminal of the counter 254 is controlled by the memory transfer command pulse CN8. Alternatively, the memory transfer command pulse CN8 can be used as a latch clock to determine a data capturing timing of the data memory 256.

The data memory 256 receives a control pulse from the horizontal scanning circuit 12 via the control line 12c. The data memory 256 stores the count, acquired from the counter 254, until the instruction in the form of the control pulse coming in via the control line 12c.

The horizontal scanning circuit 12, having a read and scan function, reads the count stored in each data memory 256 in parallel with the processes of the voltage comparator 252 and the counter 254 in the column processor 26.

In accordance with the second embodiment, the count result stored in the counter 254 is transferred to the data memory 256. The counting operation, i.e., the A/D conversion of the counter 254 and the reading operation of the counter 254 to the horizontal signal line 18 can be independently controlled. A pipeline operation in which the A/D conversion and the reading of the signal are performed in parallel is carried out.

Figure 4:
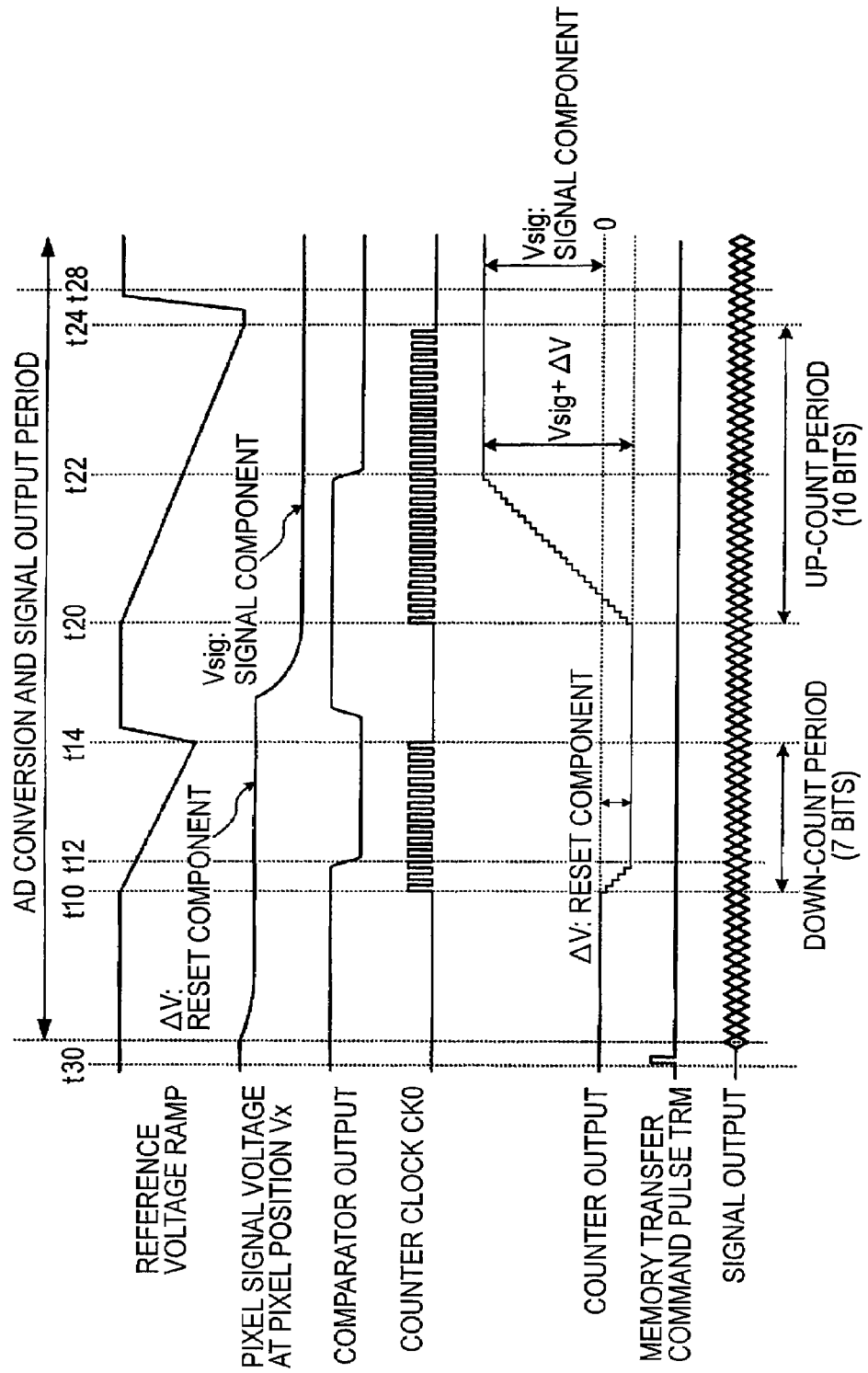
FIG. 4 is a timing diagram illustrating operation of the column A/D converter in the solid-state image pickup device in accordance with the second embodiment of the present invention.

FIG. 4 is a timing diagram illustrating operation of the column A/D converter 25 in the solid-state image pickup device 1 of the second embodiment. The A/D conversion process of the column A/D converter 25 remains unchanged from that of the first embodiment, and the detailed description thereof is omitted herein.

In accordance with the second embodiment, the data memory 256 is added to the arrangement of the first embodiment. The basic operation of the second embodiment is identical to that of the first embodiment. Prior to the operation of the counter 254 (at time t30), the count at a prior row Hx-1 is transferred to the data memory 256 in response to the memory transfer command pulse CN8 from the communication and timing controller 20.

In accordance with the first embodiment, the pixel data cannot be transferred from the column processor 26 only after the completion of the A/D conversion. In accordance with the second embodiment, no limitation is imposed on the reading process because the results of the preceding subtraction operation are already transferred to the data memory 256 prior to the first reading process (A/D conversion).

In this arrangement, the signal output operation from the data memory 256 via the horizontal signal line 18 and the output circuit 28 and the reading operation of the current Hx and the counting operation of the counter 254 are performed in parallel. Efficient signal outputting is thus performed.

The embodiments of the present invention have been discussed. The present invention is not limited to the previously discussed embodiments. A variety of changes and modifications are possible without departing from the scope of the present invention. Such changes and modifications fall within the scope of the present invention.

The previously described embodiments are not intended to limit the scope of the present invention. All of combinations of elements described in connection with the above-referenced embodiments are not always required to constitute the present invention. Only part of a combination of the elements in the above-described embodiments can be sufficient to constitute the present invention.

In the above-referenced embodiments, the column A/D converter 25 composed of the voltage comparator 252 and the counter 254 is arranged in each vertical column to obtain the digital data. Alternatively, a single column A/D converter 25 may be arranged for a plurality of vertical columns.

In the above-referenced embodiments, the A/D converter 25 is arranged in the column area on the output side of the pixel array 10. Alternatively, a single column A/D converter 25 is arranged in another area. For example, the analog pixel signal is outputted to the horizontal signal line 18, and downstream of the horizontal signal line 18, the analog signal is converted to digital signal to be transferred to the output circuit 28.

In this case, as well, the reference voltage for A/D conversion is compared with the signal containing the standard component and the signal component, the counting operation is performed in one of the down-count mode and the up-count mode in parallel with conversion operation, and the count mode is switched depending on which of the standard component and the signal component is being subjected to the comparison operation at the end of the comparison operation. The digital data representing the difference between the standard component and the signal component is thus obtained as a result of the two modes of down-count and the up-count.

The function of a memory for storing the counts for the standard component and the signal component is performed by the latch arranged in the counter. No dedicated memory for storing the A/D converted data is required. A single A/D converter is sufficient for all vertical columns. Although high-speed conversion performance is required of the converter, the circuit scale is reduced.

In the above-referenced embodiments, the second counting operation starts with the count stored in the first counting operation. If a synchronous up-down counter outputting the count in synchronization with the count clock CK0, no particular operation is required at the mode switching.

If an asynchronous up-down counter, having a high-speed advantage that an operating limiting frequency is determined only by a limiting frequency of a first flipflop, is used, the count is destroyed when the count mode is switched. A normal counting operation in succession to the count at the moment of the count mode switching cannot be performed. For this reason, an adjustment unit enabling the second counting operation to start with the count stored in the first counting operation is preferred. The adjustment unit is not discussed further herein.

In the above-referenced embodiments, the signal component Vsig appears after the reset component .DELTA.V (standard component) in the pixel signal of the same pixel in time sequence. In the first process, the comparison operation and the down-counting operation are performed on the reset component .DELTA.V (standard component) so that the subsequent unit performs a positive signal (the higher the signal level, the large the positive value thereof). In the second process, the comparison operation and the up-counting operation are performed on the signal component Vsig. Regardless of the sequential order of appearance of the standard component and the signal component, the combination and process order of the component to be processed and the count mode are optional. Depending on the process order, the digital data obtained in the second process can be negative. In such a case, a correction operation may be performed.

The pixel array 10 may be required to read the reset component .DELTA.V subsequent to the signal component Vsig, and the subsequent unit may be required to process a positive signal. In such a case, to achieve efficient processing, the comparison operation and the down-count operation are performed on the signal component Vsig in the first process, and the comparison operation and the up-count operation are performed on the reset component .DELTA.V (standard component) in the second process.

In accordance with the above-referenced embodiments, the up-down counter is commonly used with the count mode switched between the up-count mode and the down-count mode. It is sufficient if a combination of the down-count mode and the up-count mode is performed on the standard component and the signal component. The present invention is not limited to the use of the mode-switchable up-down counter.

For example, a counter may be composed of a down-counting circuit for performing the down-counting operation subsequent to the comparison operation on one of the standard component and the standard component, and an up-counting circuit for performing the up-counting operation subsequent to the comparison operation to the other of the standard component and the signal component.

Figure 5A:
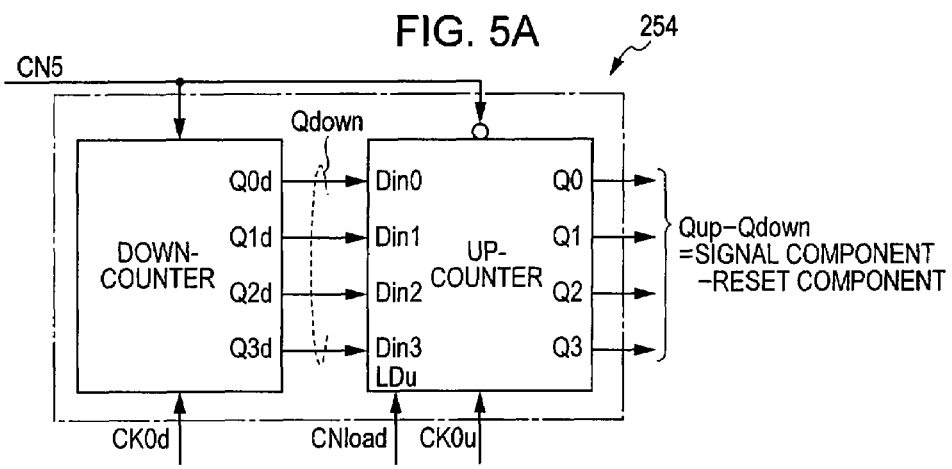
FIGS. 5A-5C are block diagrams illustrating counters.

In such a case, the counting circuit for performing the second counting operation is any of the known art that enables any initial value to be loaded. If the up-counting operation is performed subsequent to the down-counting operation, the down-counter is operated in the first process, and the up-counter is operated in the second process as shown in FIG. 5A.

Prior to the start of the up-counting operation subsequent to the count mode switching in response to the control signal CN5 for count mode switching, a load terminal LDu of the up-counter is supplied with a switch control signal CNload for setting an initial value. In this way, the down-count acquired in the down-counting operation is set in the up-counter.

Figure 5B:
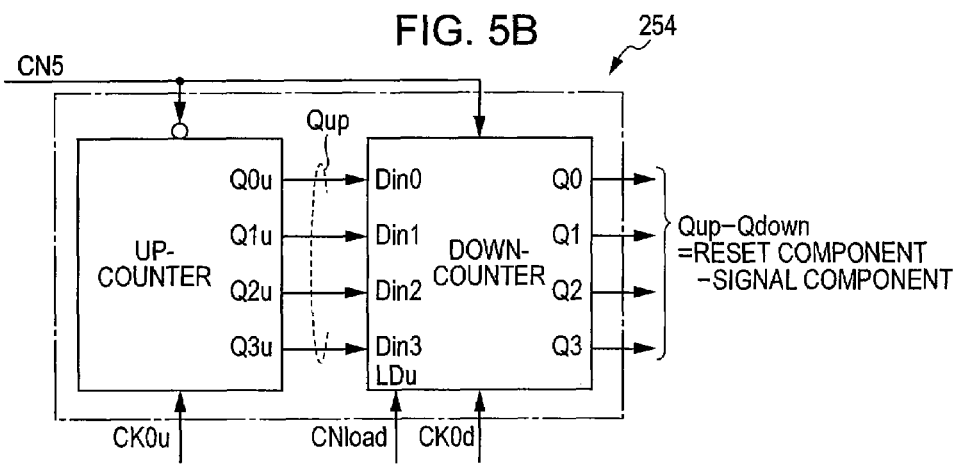

If the down-counting operation is performed subsequent to the up-counting operation, the up-counter is operated in the first process, and the down-counter is operated in the second process as shown in FIG. 5B.

Prior to the start of the down-counting operation subsequent to the count mode switching in response to the control signal CN5 for count mode switching, a load terminal LDd of the down-counter is supplied with a switch control signal CNload for setting an initial value. In this way, the up-count acquired in the up-counting operation is set in the down-counter.

In any of the arrangements of FIGS. 5A and 5B, the output of the second counter is directly obtained as a result of the subtraction operation between the standard component and the signal component. No particular subtracter for determining a difference between the standard component and the signal component is required. The arrangement eliminates the need for the data transfer to the subtracter, which is required in the non-patent document 1. Increases in noise, current, and power consumption are avoided.

Figure 5C:
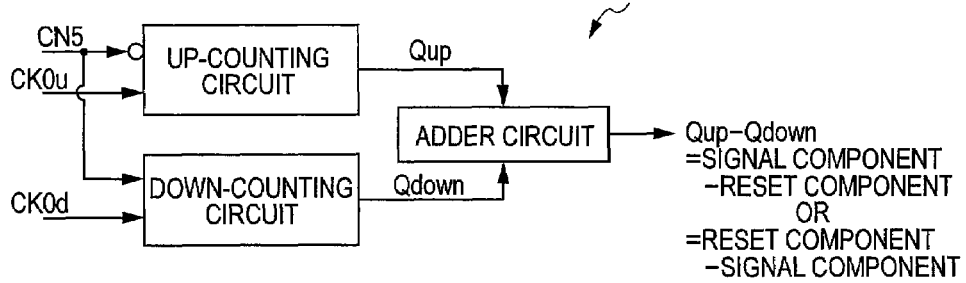

In the counter composed of a down-counting circuit and an up-counting circuit, the second counting operation may start with zero rather than the count acquired in the first counting operation. In this case, as shown in FIG. 5C, an adder for adding an output Qup of the up-countering circuit and an output Qdown of the down-counting circuit is required. Since the adder is arranged in each A/D converter, the length of wiring lines is short. Increases in noise, current, and power consumption are avoided.

In each of the arrangements of FIGS. 5A-5C, the communication and timing controller 20 issues an operation command to the down-counting circuit and the up-counting circuit as in the preceding embodiments. Both the down-counting circuit and the up-counting circuit are operated in response to the count clock CK0.

In accordance with the above-referenced embodiments, the unit element is constructed of an NMOS. Alternatively, the unit element may be constructed of PMOS. In such a case, the same advantages are also provided with the voltage positive and negative relationship inverted.

In accordance with the above-referenced embodiments, the solid-state image pickup device reading a signal from an individual unit pixel through address control is the CMOS sensor for generating a signal charge by receiving light. The signal charge is generated not only by light but also by another type of general electromagnetic waves such as rays including infrared light, ultraviolet light, and X-rays. The present invention is applicable to a semiconductor device including a great deal of unit elements, each unit element outputting an analog signal in response to the intensity of the electromagnetic wave.

In accordance with the above-referenced embodiments, the solid-state image pickup device includes the A/D converter including the comparator and the counter. The comparator compares the reference voltage for A/D conversion with each of the signals corresponding to the standard component and the signal component. The counter performs the counting operation in one of the down-count mode and the up-count mode in parallel with the comparison operation, and stores the count at the moment the comparison operation is complete. The A/D converter is not limited to the solid-state image pickup device. The A/D converter is applicable to any electronic apparatus that performs A/D converts a difference signal between two signal components.

The A/D converter is applicable not only to the solid-state image pickup device and the electronic apparatus, but also to an integrated circuit and an A/D converting module, which is typically supplied as an individual device.

The A/D converter includes the comparator and the counter. Alternatively, the integrated circuit (IC) may further include on the same semiconductor substrate thereof the reference signal generator for generating the reference signal for A/D conversion and supplying the reference signal to the comparator, and the controller for switching the count mode of the counter depending on whether the comparator has performed the comparison operation on the standard component and the signal component. Such an IC and individual chips may be constructed into a module.

The use of the modular construction permits functional units required to control the comparator and the counter to be collectively integrated. The handling and management of the modules are thus easy. Since the elements required for the A/D conversion are combined in an IC or a module in a unitary body, the manufacture of the solid-state image pickup device and other electronic apparatuses is easy.

What is claimed is:

1. A driving method of a CMOS image sensor comprising:
    comparing a reset signal sent from an imaging area with a reference signal sent from a reference signal generating portion;
    performing a first counting operation in one of a down-count mode and an up-count mode in parallel with comparing the reset signal with the reference signal;

comparing an image signal sent from the imaging area with a reference signal sent from the reference signal generating portion; and performing a second counting operation in the other of the down-count mode and the up-count mode in parallel with comparing the image signal with the reference signal, wherein bit length allocated to a maximum period of the first counting operation is set to be shorter than that allocated to a maximum period of the second counting operation.

2. The driving method of a CMOS image sensor according to claim 1, wherein the first counting operation is performed after the second counting operation is completed.

3. The driving method of a CMOS image sensor according to claim 1, wherein the second counting operation is performed after the first counting operation is completed.

4. A CMOS image sensor comprising:

a comparator part configured to compare a signal sent from an imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein bit length allocated to a maximum period of the first counting operation is set to be shorter than that allocated to a maximum period of the second counting operation.

5. A module comprising:

A/D conversion part including a comparator part configured to compare a signal sent from an imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein bit length allocated to a maximum period of the first counting operation is set to be shorter than that allocated to a maximum period of the second counting operation.

6. An electronic apparatus comprising:

a CMOS image sensor having an imaging area including a plurality of pixels, a comparator part configured to compare a signal sent from the imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein bit length allocated to a maximum period of the first counting operation is set to be shorter than that allocated to a maximum period of the second counting operation.

7. A driving method of a CMOS image sensor comprising:

comparing a reset signal sent from an imaging area with a reference signal sent from a reference signal generating portion;

performing a first counting operation in one of a down-count mode and an up-count mode in parallel with comparing the reset signal with the reference signal;

comparing an image signal sent from the imaging area with a reference signal sent from the reference signal generating portion; and performing a second counting operation in the other of the down-count mode and the up-count mode in parallel with comparing the image signal with the reference signal, wherein the reference signal used to compare with the resent signal has same variation characteristics as the reference signal used to compare with the image signal.

8. The driving method of a CMOS image sensor according to claim 7, wherein the first counting operation is performed after the second counting operation is completed.

9. The driving method of a CMOS image sensor according to claim 7, wherein the second counting operation is performed after the first counting operation is completed.

10. A CMOS image sensor comprising:

a comparator part configured to compare a signal sent from an imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein the reference signal used to compare with the resent signal has same variation characteristics as the reference signal used to compare with the image signal.

11. A module comprising:

an A/D conversion part including a comparator part configured to compare a signal sent from an imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein the reference signal used to compare with the resent signal has same variation characteristics as the reference signal used to compare with the image signal.

12. An electronic apparatus comprising:

a CMOS image sensor having an imaging area including a plurality of pixels, a comparator part configured to compare a signal sent from the imaging area with a reference signal sent from a reference signal generating portion and a counter part configured to count selectively in one of a down-count mode and an up-count mode in parallel with a comparing operation said comparator part performs, wherein a comparator in said comparator part compares a reset signal sent from the imaging area with a reference signal sent from a reference signal generating portion;

a counter in said counter part performs a first counting operation in one of the down-count mode and the up-count mode in parallel with said comparator comparing the reset signal with the reference signal;

said comparator compares an image signal sent from the imaging area with a reference signal sent from the reference signal generating portion; and said counter performs a second counting operation in the other of the down-count mode and the up-count mode in parallel with said comparator comparing the image signal with the reference signal, and further wherein the reference signal used to compare with the resent signal has same variation characteristics as the reference signal used to compare with the image signal.

* * * * *